United States Patent [19]

Gamand et al.

[11] Patent Number: 5,386,130

[45] Date of Patent: Jan. 31, 1995

[54] SEMICONDUCTOR DEVICE COMPRISING A BROADBAND AND HIGH-GAIN MONOLITHIC INTEGRATED CIRCUIT FOR A DISTRIBUTED AMPLIFIER

[75] Inventors: Patrice Gamand, Yerres; Christian Caux, La Garenne Colombes, both of France

[73] Assignee: U.S. Philips Corporation, New York, N.Y.

[21] Appl. No.: 146,765

[22] Filed: Nov. 2, 1993

[30] Foreign Application Priority Data

Nov. 4, 1992 [FR] France .................. 92 13242

[51] Int. Cl.⁶ ........................................ H01L 29/80
[52] U.S. Cl. ........................ 257/275; 257/276; 257/277; 257/536; 330/277
[58] Field of Search .............. 257/259, 275, 276, 277, 257/580, 581, 577, 379, 539, 536; 330/277, 296, 307

[56] References Cited

U.S. PATENT DOCUMENTS

| | | | |
|---|---|---|---|
| 4,072,979 | 2/1978 | Palara | 257/580 |
| 4,456,888 | 6/1984 | Ayasli | 330/277 |
| 4,751,562 | 6/1988 | Yamamura | 257/277 |
| 4,853,649 | 8/1989 | Seino et al. | 330/277 |
| 4,864,250 | 9/1989 | Bacon | 330/277 |
| 4,939,485 | 7/1990 | Eisenberg | 257/277 |
| 5,170,235 | 12/1992 | Tanino | 257/276 |

FOREIGN PATENT DOCUMENTS

| | | | |
|---|---|---|---|
| 4-100276 | 4/1992 | Japan | 257/379 |
| 2211988 | 7/1989 | United Kingdom | 257/580 |

OTHER PUBLICATIONS

1991 IEEE MTT-S International Microwave Symposium Digest, vol. 2, 10 Jun. 1991, Boston, pp. 437–440.

Primary Examiner—Andrew J. James
Assistant Examiner—Courtney A. Bowers
Attorney, Agent, or Firm—Robert J. Kraus

[57] ABSTRACT

Semiconductor device including a distributed-type monolithic integrated circuit on a substrate, operating in the high frequency and/or microwave range, this distributed circuit having a plurality of coupled stages each having at least a transistor with a first electrode being AC connected to ground. The first electrode is connected to ground by two branches, a first branch being connected directly to a first ground stub and a second branch being connected to a second ground stub through a resistor.

11 Claims, 6 Drawing Sheets

SEMICONDUCTOR DEVICE COMPRISING A BROADBAND AND HIGH-GAIN MONOLITHIC INTEGRATED CIRCUIT FOR A DISTRIBUTED AMPLIFIER

BACKGROUND OF THE INVENTION

The invention relates to semiconductor device comprising a distributed-type monolithic integrated circuit on a substrate, operating in the high frequency and/or microwave range, this distributed circuit comprising a plurality of coupled stages having each at least a transistor with electrodes, at least one of these electrodes called, first electrode, being AC connected to ground.

The invention finds its application in realising monolithic microwave integrated circuits (MMICs) to be used in the field of telecommunications.

A distributed amplifier is already known from U.S. Pat. No. 4,853,649. This document describes an amplifier comprising a plurality of coupled field effect transistor elements whose gates are connected to a gate line and whose drains are connected to a drain line, this gate line and drain line being formed by inductors. On the other hand, the sources of the transistors in this amplifier have a self-bias circuit for regulating the DC source potential to a given value.

This source self-bias circuit which is connected to each individual transistor of the distributed amplifier has a capacitor and a resistor arranged in parallel between each source and ground.

The capacitor is used for connecting the source to ground in the microwave range. Thus it has to have a sufficiently high value to realise a microwave short-circuit, for example, 3 to 4 times the value of the gate-source capacitance of the transistor.

The resistor is used for adjusting the value of the DC source potential relative to ground. It is thus to have a sufficiently high value for a convenient, not negligible, potential to be established at its terminals.

This resistor-capacitor arrangement has a detrimental effect in that it creates or amplifies oscillations which already have the tendency of occurring anyhow in a high-gain distributed amplifier.

On the other hand, this arrangement is applied to transistors of the interdigitated type which have one drain finger, two gate fingers arranged on either one of the two sides of the drain finger and, futhermore, two source fingers arranged on either one of the two sides of the ensemble.

In an embodiment of prior-art circuit the transistors are disposed in line on a substrate, while the electrodes are arranged in parallel, the source fingers of one transistor thus being opposite to a source finger of the preceding transistor and a source finger of the next transistor, except for the first and last transistors.

A metal coating is disposed between the transistors to form a ground stub. This metal coating is connected to a ground plane realised on the opposite side of the substrate by a via hole.

In a particular embodiment of prior-art circuit illustrated by FIG. 15 of said document, each source finger is connected via an air bridge to a planar capacitor realised on the surface of the ground stub, so that in this manner two capacitors are realised facing each other between the transistors and being in line with these transistors. For each transistor one of the source fingers is lengthened by a conducting line to connect this source finger to a resistor located in a part of the substrate surface between the conducting line and the ground stub, but not in line with the transistors.

According to said document this configuration has been chosen to avoid modifying the dimensions of the microwave lines which form inductors that connect the drains of the transistors to form the drain line, as well as those of the microwave lines that have a similar function in forming the gate line.

The problem is actually that the capacitors of the self-bias circuits to be realised between source fingers and ground stubs have, as a result of their function, rather large dimensions; but because of their planar structure they can be realised on the surface of the ground stub and, using the shape of an isolation slit made between two facing capacitors, they can be integrated without causing the distance between transistors to be increased too much. In contrast, it is impossible in this embodiment also to place the resistors of the self-bias circuits in line with the transistors and the capacitors, for if they are inserted between the transistors this would entail too large changes of the dimensions of the gate line and drain line compared with a similar circuit not including source self-bias systems, due to the fact that the dimensions of these resistors are rather large.

In said described embodiment the two source fingers of the same transistor are not interconnected and only one of these fingers comprises the RC self-bias circuit. Thus, the transistors in FIG. 15 of said document operate each as a transistor half.

On the other hand, it will be noted that the resistors of the self-bias circuits are located exactly between the sources of the transistors and ground, because the inductances of the via holes, which holes connect the ground stubs to the ground plane, are negligible compared with the impedances which constitute these self-bias circuits and are thus not taken into account for the operation thereof.

The need to realise high-gain amplifiers which have a large bandwidth up to high or microwave frequencies, has provided that the distributed amplifier can be chosen as an element for this sort of application.

Microstrip technology is the technology selected for realising the distributed amplifier known from said document.

In this technology a first surface called the front surface of the substrate which is here made of GaAs carries the active elements, conducting strips to form transmission lines and metal islands to form the ground stubs. And the second surface of the substrate called rear surface of the substrate carries a metal island to form ground, so that the line impedance is a function of the width and length of the stripline conductors of the first surface and of the thickness of the substrate. Moreover, via holes located in the central parts of the ground stubs are formed through the substrate, to bring the potential of the ground plane on the rear surface of the substrate to these ground stubs on the front surface of the substrate.

Said document describes that when optimizing means are used for optimizing the distributed amplifier circuit to increase the width of the passband and/or increase the gain, there will be a drawback: the parasitic elements inherent in the circuit will generate oscillations.

Particularly at high or microwave frequencies the parasitic gate-drain capacitance ($C_{gd}$) becomes a very critical parameter and oscillations appear at frequencies which are higher than that of the passband of the amplifier.

In the state of the art there are other distributed circuits such as mixers which are formed in stages, for example, of the cascaded type and which are subject to the same drawbacks as the distributed amplifiers.

SUMMARY OF THE INVENTION

It is an object of the invention to provide means for realising a device which comprises a distributed integrated circuit, while protecting itself against the occurrence of oscillation at high frequencies of the operating frequency band.

This object is achieved by a device defined in the opening paragraph, and is further characterized in that in each considered AC stage said first electrode is connected to ground through two branches, one branch called first branch being connected directly to a first ground stub, and a branch called second branch being connected to a second ground stub through a resistor.

It is an object of the invention to provide a device which comprises a distributed circuit that can be easily integrated.

This object is achieved by this device further characterized in that in the distributed circuit the stages are disposed opposite to one another, so that for each considered stage the first ground stub is used in common with the second ground stub of the preceding stage or of the next stage, and the second ground stub is used in common with the first ground stub of the next stage or of the preceding stage respectively, so that with this arrangement in the AC mode, said first electrode of the transistor in each considered stage is connected, on the one hand, to ground via the inductor of the first ground stub, and, on the other hand, to said first electrodes of the preceding and next stages by the resistors of their second branches respectively.

It is a further object of the invention to propose a device comprising an amplifier circuit whose performance is improved compared with the state-of-the-art circuit.

This object is achieved by means of this device additionally characterized in that the distributed circuit is a high-gain broadband amplifier circuit, this amplifier circuit comprising a plurality of coupled stages having each at least a field effect transistor whose source constitutes said first electrode and whose gate and drain are connected to a line called gate line and to a line called drain line respectively, formed by inductors.

It is a further object of the invention to propose a device comprising an amplifier circuit which can be easily integrated in high-performance technique.

This object is achieved by this device moreover characterized in that in this amplifier circuit each transistor is an interdigitated transistor whose source is constituted by at least two source finger stubs, called external stubs, disposed on either one of the two sides of the other interdigitated electrode stubs of this transistor, in that for each transistor all the source finger stubs are directly interconnected by means of a conductor, and in that one of the two external source finger stubs, called first stub, forms said first branch connected directly to the first ground stub and the other of the two external source finger stubs, called second stub, forms said second branch connected to the second ground stub through said resistor.

In a particular embodiment this device is characterized in that the transistors to form the distributed amplifier are disposed in line on the surface of the substrate, with their interdigitated electrode stubs disposed perpendicularly to this line, each transistor having said second source finger stub facing said first source finger stub of the next transistor of the amplifier circuit, in that the ground stubs divided by these two transistors are disposed between these transistors and in line therewith, in similar fashion to said second and said first facing source finger stubs, and in that for each transistor said low-value resistance is realised by the overlap between said second source finger stub and the ground stub adjacent thereto.

It is another object of the invention to provide means for realising a device which comprises a distributed amplifier circuit whose passband is increased to the high frequency range without thereby presenting a risk of oscillations occurring in the high frequency range.

This object is achieved by this device moreover characterized in that each stage of the distributed amplifier is of the cascoded type in which there is coupled to each transistor called bottom transistor of the distributed amplifier in a common source arrangement to ground, a transistor called top transistor in a common gate arrangement to ground in the high frequency and/or microwave range, the gate constituting said first electrode of this cascoded stage and being DC isolated from ground by capacitors.

BRIEF DESCRIPTION OF THE DRAWING

The invention will be described in detail hereinafter with reference to the appended block diagrams shown in the drawing Figures, in which:

FIG. 2b shows a particular embodiment for the circuit shown in FIG. 2a;

FIG. 3b shows the equivalent circuit diagram of the structure of FIG. 3a;

FIG. 3c shows an example of the topology for utilizing the structure shown in FIG. 3a;

DESCRIPTION OF THE PREFERRED EMBODIMENT

The invention relates to numerous distributed circuits operating at a high and/or microwave frequency and, especially, to distributed amplifiers and distributed mixers. The latter have a structure which is comparable to that of distributed amplifiers of the cascoded type.

The description that follows relates by way of example to a distributed amplifier integrated circuit in a semiconductor device.

Figure 1:
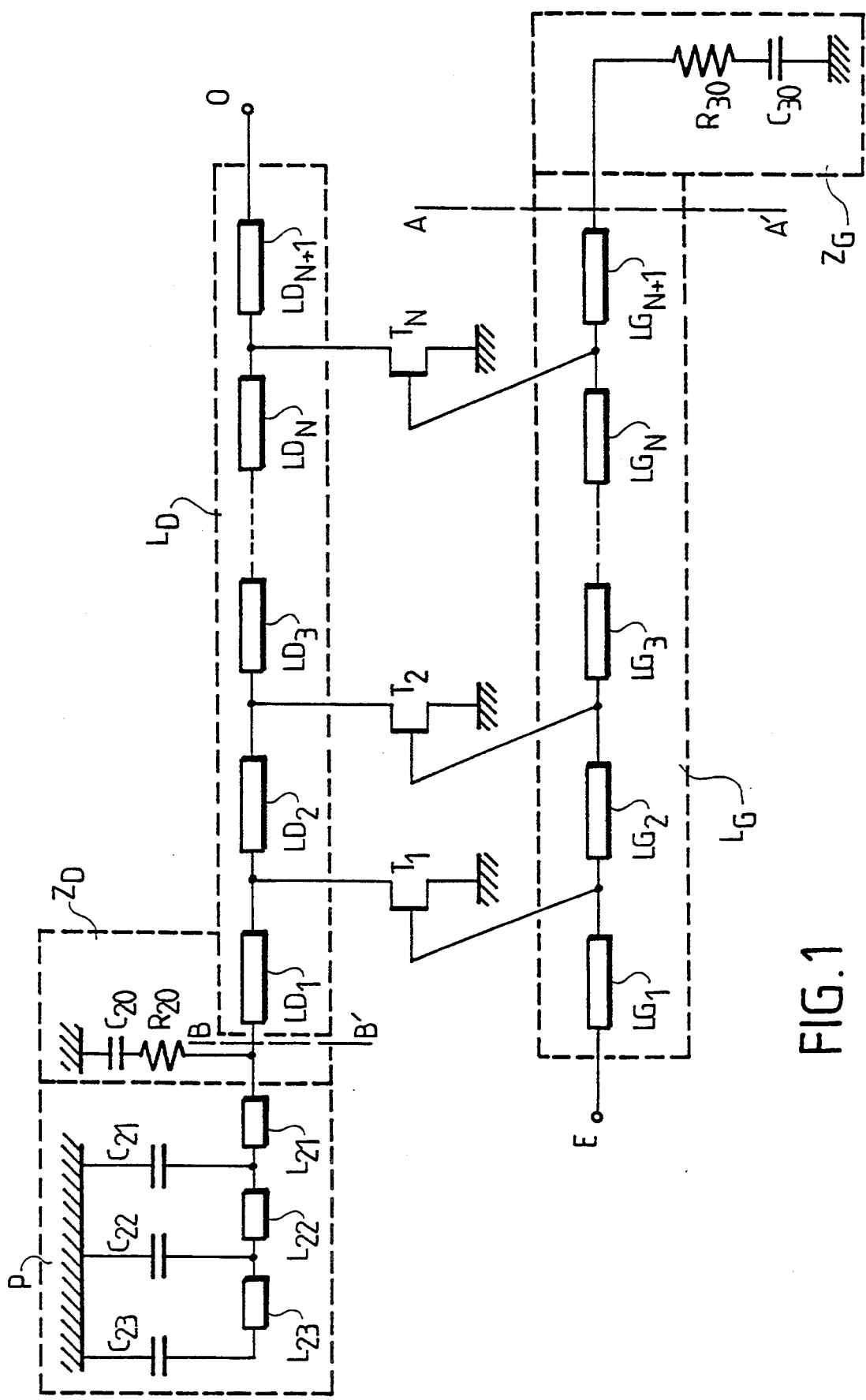
FIG. 1 shows an example of a block diagram of a distributed amplifier circuit.

Reference is made to FIG. 1 in which a distributed amplifier represented by way of non-limiting example comprises a plurality of field effect transistors $T_1$, $T_2$, . . . $T_N$. . . arranged to have a common source, a first line $L_G$ formed by the microwave line sections having impedance $LG_1$, $LG_2$ ... $LG_{N+1}$ respectively, and a second line $L_D$ formed by microwave line sections having impedance $LD_1$, $LD_2$ ... respectively.

The gates of the transistors $T_1$, $T_2$, ... are periodically connected to the line $L_P$ called gate line, between the respective microwave line sections $LG_1$, $LG_2$ ....

The drains of the transistors $T_1$, $T_2$, ... are periodically connected to the line $L_D$ called drain line, between the respective microwave line sections $LD_1$, $LD_2$ ....

A microwave input signal E is applied to this amplifier at the end of the gate line $L_G$, and the amplified microwave output signal is tapped from the end of the drain line.

The natural impedances $LG_1$, $LG_2$ belonging to the gate line $L_G$, together with the intrinsic gate-source capacitances of the field effect transistors $T_1$, $T_2$ ..., form a distributed microwave line called artificial transmission line.

The same holds for the drain line $L_D$ between the natural impedances $LD_1$, $LD_2$ and the drain-source capacitances of the field effect transistors $T_1$, $T_2$ ....

The operating principle of the distributed amplifier is based on the propagation of the signals along the thus formed artificial transmission lines. When the microwave signal E is applied to the gate line, it is propagated while each transistor which then produces an output power capable of propagating over the drain line is driven. If the phase velocity of the two artificial transmission lines is identical, the power increases in phase during the propagation along the drain line. It is thus possible to reach an amplification in a frequency band, which is restricted among other things by the cut-off frequency of the transmission lines.

When the amplifier operates at various frequencies in the microwave domain, it is evident that the line sections $LG_1$, $LG_2$, ..., $LD_1$, $LD_2$, ... may represent small transmission line sections for frequencies such as 20 GHz. The length of these sections is calculated so as to ensure the phase shift which is necessary for a proper functioning of the amplifier.

The amplifier further includes at least a bias circuit. Such a bias circuit P is arranged at the end of the line $L_D$ opposite to the output O. This bias circuit P comprises, for example, microwave transmission line sections $L_{21}$, $L_{22}$, $L_{23}$, ... and capacitors $C_{21}$, $C_{22}$, $C_{23}$ inserted between ground and the nodes between each of these line sections $L_{21}$, $L_{22}$, $L_{23}$ ....

The gate line $L_G$ and the drain line $L_D$ are further connected to a load $Z_G$ and a load $Z_D$.

The load applied to the gate line $L_G$ may be formed by a series combination of a resistor $r_{30}$ and a capacitor $C_{30}$ and inserted between the output of line $L_G$ and ground.

The operating frequency of such a distributed amplifier is restricted in theory, on the one hand, by the cut-off frequency of the field effect transistors and, on the other hand, by the cut-off frequency of the artificial transmission lines as observed hereinbefore.

In effect, the real cut-off frequency of the circuit is well below these theoretical frequencies, for this cut-off frequency is restricted by multiple reflections and resonance phenomena resulting therefrom. These phenomena are due to the variation of the characteristic impedances of the lines when the operating frequency varies, and the only improvement of the biasing is not sufficient to suppress these phenomena. These reflection phenomena particularly appear on the gate line, at the plane AA', between the last line section $L_{N+1}$ and the load $Z_G$, while the wave on the gate line is conveyed from the input E towards this load $Z_G$.

On the drain line, part of the wave is directed towards the plane BB' between the line section $L'_1$ and the load $Z_D$. But the latter incident wave arriving at BB' is very much attenuated, so that the reflections are very weak and do not need the addition of a compensation circuit.

Figure 2A:
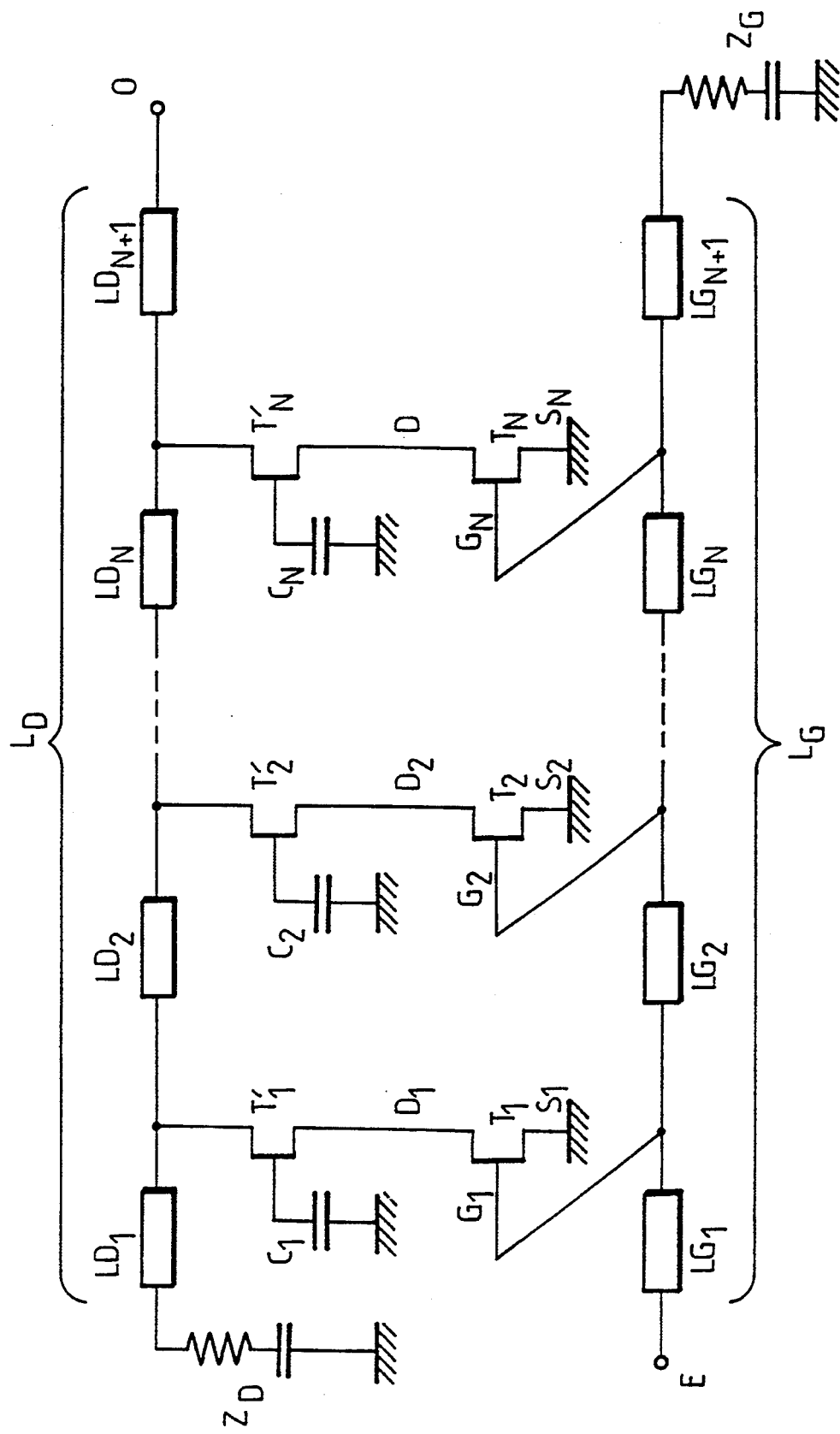
FIG. 2a shows an example of a block diagram for realising a distributed amplifier circuit whose passband is extended to high frequencies.

To widen the passband of a distributed amplifier as described hereinbefore, it is possible, for example, with reference to FIG. 2a, to use for each of these stages an arrangement called cascaded arrangement. This avoids high frequency gain losses which appear in the circuit known from the cited state-of-the-art document.

Each cascaded stage comprises, inserted between the drain of the transistor $T_1$, $T_2$, $T_N$ of a conventional distributed amplifier stage and the drain line $L_P$, an additional transistor $T'_1$, $T'_2$, ... $T'_N$ whose gate is connected to ground through a capacitor $C_1$, $C_2$, $C_N$ respectively.

The cascaded arrangement thus consists of connecting in each distributed amplifier stage a microwave top transistor $T'_1$, $T'_2$, ... $T'_N$ in a common gate arrangement connected to ground at microwave frequencies through the DC isolation capacitor $C_1$ ... $C_N$ to a bottom transistor $T_1$, $T_2$, ... $T_N$ in a common source arrangement.

Thus the advantage is achieved that the coupling between the gate line and the drain line has diminished and that in this manner the passband of the distributed amplifier circuit is considerably increased with respect to high frequencies, without a loss of gain.

Figure 2B:
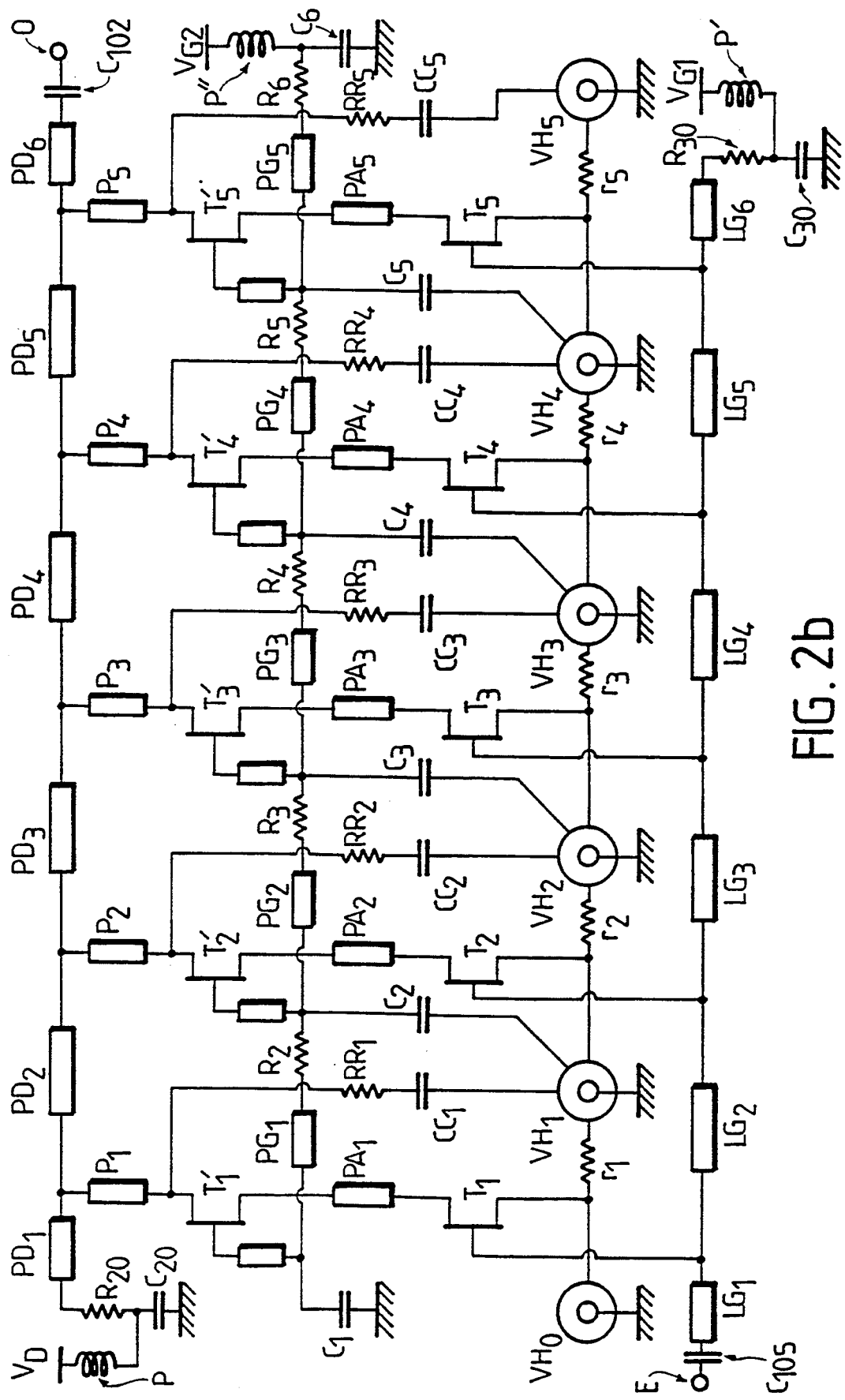

In an embodiment of the cascaded structure described hereinbefore and with reference to FIG. 2b, the various active elements are interconnected and connected to the gate line and the drain line by microwave line sections.

Thus, the drains of the top transistors $T'_1$, $T'_2$, ..., $T'_N$ are connected to the drain line by the respective lines $P_1$, $P_2$ ... $P_N$, the drain line thus comprising line sections $PD_1$, $PD_2$, ... $PD_{N+1}$.

The high and bottom transistors $T'_1$ and $T_1$, $T'_2$, and $T_2$, $T'_N$ and $T_N$ are connected by the respective lines $PA_1$, $PA_2$, $PA_N$.

The gates of the top transistors are connected to each other by the line sections $PG_1$, $PG_2$, ... $PG_N$.

The gate line comprises line sections $LG_1$, $LG_2$, ... $LG_{N+1}$.

In this manner the impedance variations as a function of frequency are compensated, the resonance phenomena caused by the multiple reflections are suppressed, and the coupling effect between the lines is attenuated. The biasing becomes more efficient: the transistors work under better conditions.

All these improvements together permit obtaining a wider passband whose cut-off frequency thus comes near to the theoretical cut-off frequency.

It will be noted in a distributed amplifier such as represented in FIG. 1 that the line section connected to the drain of the transistor $T_1$ at the position $LG_1$ cannot form part of the load $Z_D$, but can form part of the drain line $L_D$. Similarly, the line section connected to the gate of transistor $T_N$ at the position $LG_{N+1}$ cannot form part of the load $Z_G$, but can form part of the gate line $L_G$. This is due to the very operating principle of a distributed amplifier.

In an embodiment of the invention the distributed amplifier shown in FIG. 2b is formed by 5 field effect transistors. The transmission line sections are of the microstrip type.

The dimensions of the gate lengths $L_T$ of the transistors, the gate widths $l_r$ of the transistors, their pinch-off voltage $V_T$, the width W of the transmission lines and the length D of the transmission lines are given in Table I in the case where a five-stage amplifier is realised on gallium-arsenide (GaAs).

In the embodiment illustrated by FIG. 2b relating to a cascaded stage distributed amplifier, the drain line is biased through a circuit P connected to a DC voltage $V_P$, applied to the end opposite to output O, the gate line is biased through a circuit P' connected to a DC voltage $V_{G1}$ applied to the end opposite to the input E, and the gate line of the cascaded top transistors is biased at its output end through a circuit P'' connected to a DC voltage supply $V_{G2}$. The bias circuits P, P' , P'' preferably comprise inductors. The values of the DC bias voltages $V_D$, $V_{G1}$, $V_{G2}$ are given in Table I.

As observed hereinbefore, in a general manner the moment a person skilled in the art wishes to obtain an increase of the passband as well as high gain in a distributed amplifier, oscillations will occur which appear with higher frequencies than those of the passband.

In the case where the expert has selected to realise the cascaded combination described hereinbefore to increase the passband of the distributed amplifier, this drawback may be minimized by using in each stage a first RC filter formed by a resistor $R_2 \ldots R_{N+1}$ respectively, arranged in the gate line of the cascaded top transistors $T'_1$, $T'_2 \ldots$ between the lines $P_{G1}$, $P_{G2} \ldots$ and connected in series with the gate isolation capacitor $C_1$, $C_2 \ldots C_N$, and a second RC filter comprising a resistor $RR_1$, $RR_2$, $\ldots RR_N$ respectively, connected in series with a respective isolation capacitor $CC_1$, $CC_2$, $\ldots CC_N$, the latter elements $RR_1$-$CC_1$, $RR_2$-$CC_2$ being inserted between the drain of the top transistors $T'_1$, $T'_2 \ldots T'_N$ and ground. The gate of the top transistors $T_1 \ldots T'_N$ is thus connected to ground, on the one hand directly, and, on the other hand, through the microwave resistors $R_2 \ldots R_{N+1}$.

The values of these elements $R_1 \ldots R_N$, $C_1 \ldots C_N$, $RR_1 \ldots RR_N$, $CC_1 \ldots CC_N$ are also given in the Table I.

The inclusion of the resistors $R_2 \ldots R_{N+1}$ in the gate line of the cascaded transistors is an important stability factor.

Nevertheless, when means are used for increasing the bandwidth of the passband of a distributed amplifier it has never been possible so far to avoid the occurrence of oscillations while a high gain is maintained.

In effect, any measure taken to diminish the oscillations automatically diminishes the gain in proportions that can be incompatible.

The present invention provides a solution to this problem to the extent where the amplifier is realised in a technology which includes interdigitated transistors of which one of the electrodes, called first electrode, in the present case the source electrode, is connected to ground by large-surface ground stubs.

Referring to said state of the art one has seen that the distributed amplifier circuits are preferably realised by an interdigitated transistor technique, whereas these transistors may also be MESFETs or HEMTs having various gate fingers (at least two), one or various drain fingers and various source fingers (at least two) of which at least one source finger is disposed on either one of the two sides of the other electrodes.

Figure 3A:
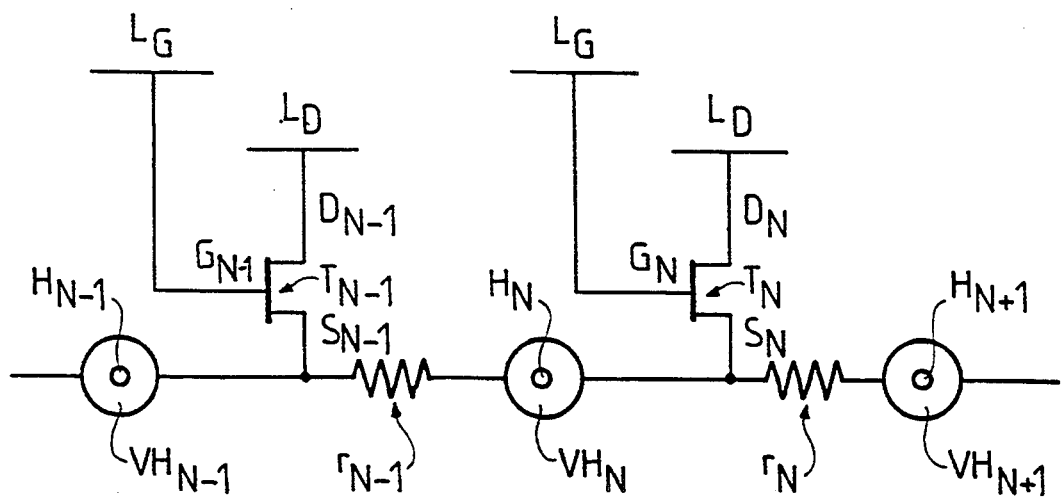
FIG. 3a shows two consecutive distributed amplifier stages and shows the connection of the transistor sources to the via holes.
Figure 3B:
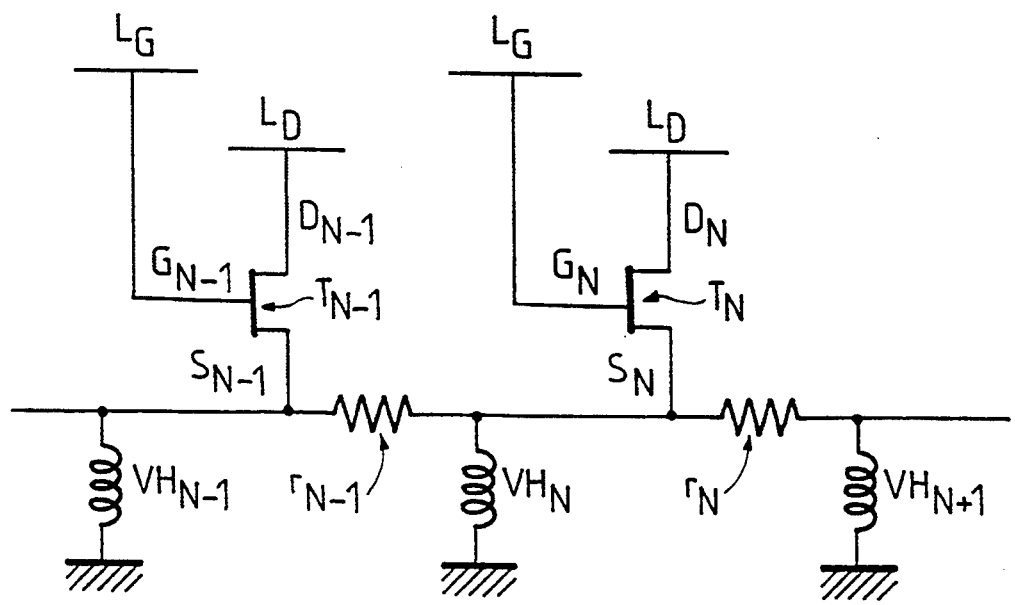
Figure 3C:
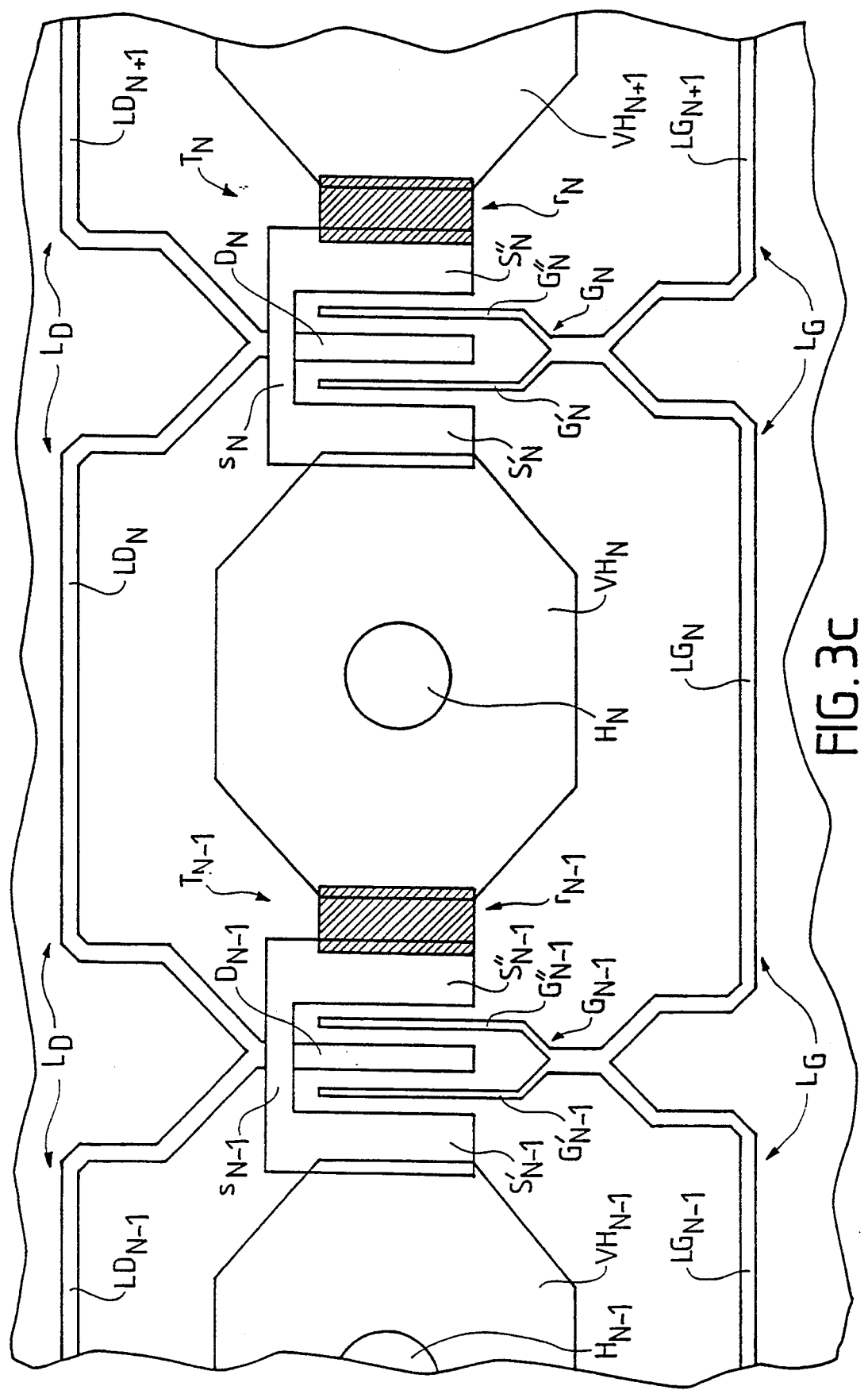

Thus, with reference to FIG. 3c, a transistor of the $N^{th}$ amplifier stage comprises at least one drain finger $D_N$, disposed between two gate fingers $G_N$, that is $G'_N$ and $G''_N$; it also comprises two source finger contacts (or stubs) $S_N$, that is $S'_N$ and $S''_N$, called first and second source finger stubs, disposed on the other side of the gate fingers $G'_N$, $G''_N$ relative to the drain finger $D_N$.

The drain finger $D_N$ is connected to line sections $LD_N$ and $LD_{N+1}$ of the drain line $L_D$ by line sections, and the two gate fingers $G'_N$, $G''_N$ are first united and then connected to the line sections $LG_N$ and $LG_{N+1}$ of the gate line $L_G$ also by line sections.

The source contacts called peripheral (or external) source contacts $S'_N$ and $S''_N$ are adjacent to the ground stubs $VH_N$ and $VH_{N+1}$ respectively.

FIG. 3c shows two successive stages comprising the transistors $T_{N-1}$ and $T_N$, of a distributed amplifier as is represented diagrammatically in FIG. 1, and not for reasons of simplicity of the drawing, corresponding to the cascaded amplifier of FIG. 2a or 2b. Without any difficulty the experts will make the necessary change for applying the invention to any sort of amplifier.

In a general manner, for integrating the circuit elements on a large scale in the microwave domain, the substrates are chosen from semiconductor materials, preferably from the III-V group such as, for example, gallium arsenide (GaAs), but many other semiconductor materials or also ceramics are possible. And furthermore, the technology is selected to be microstrip technology in which the conductors in the form of strips constitute lines and the active elements are situated on one of the surfaces of the substrate, the other surface of the substrate carrying a ground plane. Thus the integration density of the elements can be enhanced.

Preferably, to realise a distributed amplifier, all the electrodes of the corresponding transistors of all the stages are arranged in parallel and, moreover, these transistors are connected in line, so that the peripheral source fingers are disposed facing each a source finger of a preceding or next stage, except for the last and the first stage.

Under these conditions two peripheral (or external) source fingers opposite to each other share the same ground stub.

However, it should be taken into consideration that in microstrip technology, for connecting the ground stubs $VH_1 \ldots VH_N$ to the ground plane on the opposite surface of the substrate, there are to be via holes $H_1, \ldots, H_N$ in these stubs, which holes bring the ground potential of the rear face of the substrate to the ground stubs $VH_1 \ldots VH_N$.

FIG. 3a diagrammatically shows the two circuit stages corresponding to the topology shown in FIG. 3c, and FIG. 3b shows the circuit diagram equivalent to part of the circuit shown in FIG. 3a. Thus the via holes $H_1, H_2, \ldots, H_N$ associated to the stubs $VH_1, VH_2, \ldots, VH_N$, disposed in conformity with the topology shown in FIG. 3c, present as shown in FIG. 3b a low-value inductance which does not significantly degrade the performance of the transistor of the corresponding stage in its operating domain at high frequency and/or microwave frequency.

The embodiment of the invention in microstrip technology which includes ground stubs with via holes as illustrated by drawing FIGS. 3a, 3b and 3c is not restrictive. The invention may be implemented in any technology in which the large-surface ground stubs $H_1, \ldots, H_{N+1}$ are connected to low characteristic impedance ground lines as used in, for example, the cpplanar technique.

The typical value of this microstrip technology inductor varies from 20 pH ($20.10^{-12}$H) to 20 GHz ($20.10^9$ Hz) of which each transistor source actually has half, that is to say, 10 pH ($10.10^{-12}$H), because this source is connected to two stubs $VH_{N-1}$ and $VH_N$.

At the frequency of 20 GHz each transistor source thus has an impedance of:

$$10.10^{-12} \times 2\pi \times 20.10^9 = 1.2 \ \Omega$$

Figure 4:
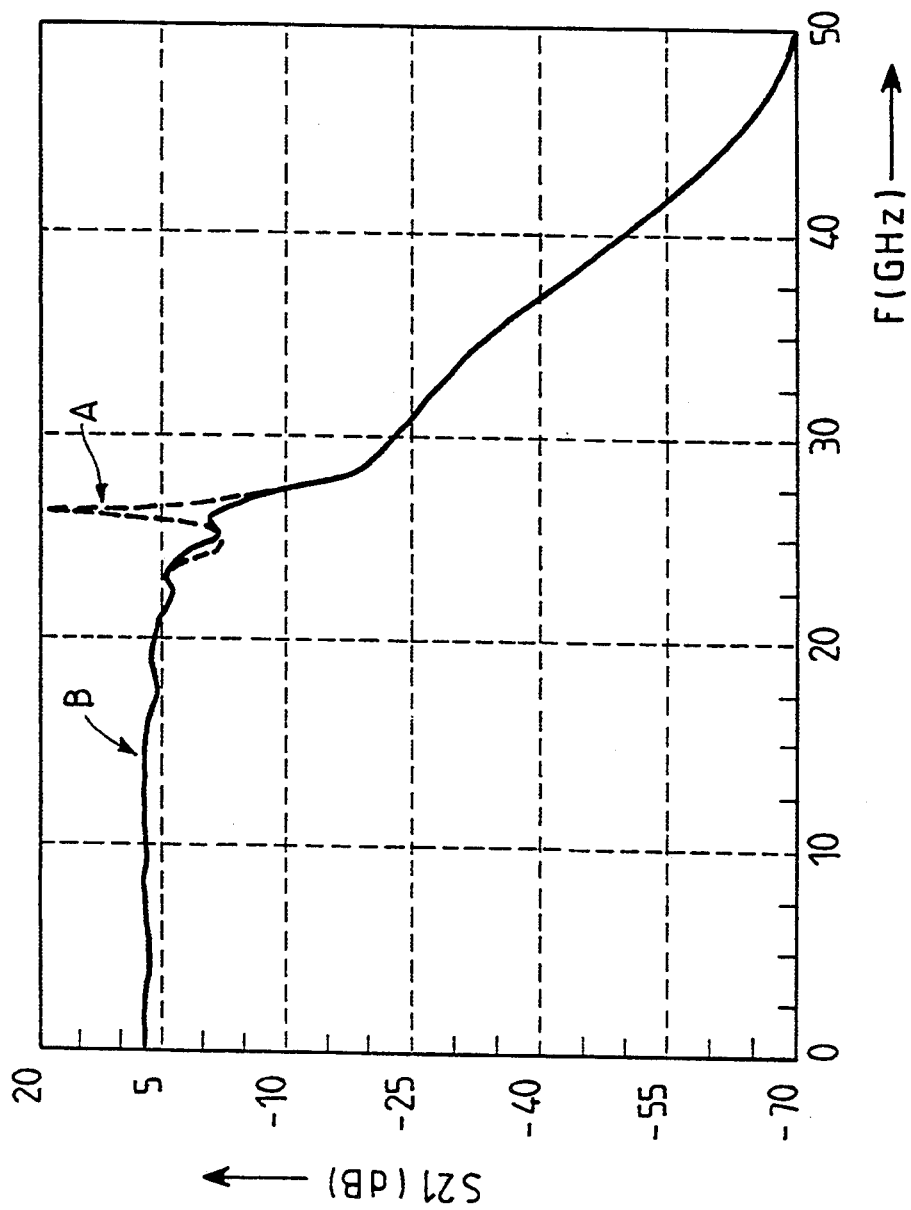
FIG. 4 shows in a diagram the dispersion coefficient S21 plotted against amplitude in dB, in which the dashed-line curve A corresponds to a prior-art distributed amplifier and the solid curve B corresponds to a distributed amplifier comprising small connecting resistors for connecting every second source finger to a via hole in accordance with the invention.

With reference to FIG. 4, which shows the amplitude in dB of the coefficient $S_{21}$, of a cascaded stage distributed amplifier, curve A shows in a dashed line high frequency oscillations when no measure is taken to suppress them.

Such a disadvantage must absolutely be avoided. The distributed amplifier is thus to have both its passband increased, a high gain maintained, and the possible occurrence of oscillations at frequencies higher than those of the passband completely suppressed.

According to the invention the solution found for the prevention of oscillations without a reduction of gain is found in that a resistor r of low value is inserted between one of the source fingers and its corresponding metallized ground stub.

For example, with reference to FIG. 3c, a low-value resistor $r_N$ is inserted into the stage of the transistor $T_N$, between the source finger stub $S''_N$ called second source finger stub and the ground stub $VH_N$.

A low-value resistor $r_{N-1}$ is also inserted into the stage of the transistor $T_{N-1}$ between said second source finger stub $S''_{N-1}$ and the ground stub $VH_{N-1}$. And this is carried out in each stage of the distributed amplifier.

Furthermore, the two (or more) source fingers (or stubs) $S'_N$-$S''_N$ are to be interconnected by a conductor $S_N$ realised at a different level from the other parts of the transistor (in FIG. 3c the drain finger $D_N$) which this conductor is to cross. And the same is to take place in all the stages of the amplifier.

Thus, with reference to FIGS. 3a and 3b in one branch the source of a transistor is directly connected to a ground stub with a via hole by one of the source electrode fingers (or stubs) (for example, said first stub $S'_N$ and $H_N-VH_N$) and also, in a parallel arrangement, in another branch, the source electrode is connected to a second ground stub with a via hole (for example, said second stub $S''_N$ and $H_{N+1}-VH_{N+1}$) through a low-value resistor $r_N$.

This narrows down to the fact that the source $S_N$ of each transistor $T_N$ is connected to ground by a branch having only a low inductance of 20 pH, that is to say, 2.5 $\Omega$ at 20 GHz, and also to preceding and following transistor sources via branches comprising said low-value resistor $r_N$.

If the low-value resistor $r_N$ is selected to have a value of, for example 5 $\Omega$, the result is that the source $S_N$ of the transistor $T_N$ has an impedance to be denoted hereinafter by $Z_N$ and which bears a proportion to a low inductance $L_N$ corresponding to $H_N-VH_N$ disposed between the source node $S_N$ and ground, with in a parallel combination, a low-value inductor $L_{N+1}$ corresponding to $H_{N+1}-VH_{N+1}$ in a series combination with said low-value resistor $r_N$ placed between the source node $S_N$ and ground. The calculation of this impedance $Z_N$ leads to the following equations:

$$Z_N = \frac{jL\omega}{r + jL\omega} \approx \frac{rL^4\omega}{r^2 + 2\omega^2 L} + jw\frac{[2L^3\omega^2 + r^2 L]}{r^2 + 2\omega^2 L}$$

In these formulas $r = r_N$ and $L = L_{N+1}$. This calculation leads to the fact that the source of the transistors $T_N$ is directly connected to ground for the DC biasing, and that in the microwave range the real part $Z_N$ tends towards $r/4$ when the frequency increases. Thus, the result of the use of said low-value resistors $r_N$ arranged according to the invention is that the oscillations can be cancelled without the gain being diminished.

Experiments have shown with reference to FIG. 4 that this diagram is sufficient to suppress the oscillations without diminishing the gain of the amplifier, as is shown in curve B in a solid line.

On the technological level, as shown in FIG. 3c, its is thus up to the expect to place the low-value resistors $r_1$, $r_2$, $l_N$ between one of the peripheral source contacts and the ground stub $VH_{N+1}$ with a corresponding adjacent via hole.

This type of solution is suitable for practically all the currently realised high frequency circuits and/or microwave circuits, because they most often include interdigitated transistors and ground stubs of the type with via holes or equivalents. The resistors $r_N$ having low values in principle can be realised by a resistive layer which overlaps said second source finger stub $S''_N$ of a transistor $T_N$ and the adjacent ground stub $VH_{N+1}$. Thus, there is no need to change the distance separating a given transistor from the next, and thus the line and the drain line can remain identical with what they would be without the means according to the invention.

As has been stated hereinbefore, the expert can contemplate adapted embodiments of the invention in the case where the ground stubs have a different structure from the represented in FIG. 3, for example, ground stubs not with via holes but being connected to low characteristic impedance ground lines as is done in coplanar technology for example.

TABLE I

| Lines | D Length (μm) | W Width (μm) |
| --- | --- | --- |
| PA | 400 | 15 |
| PD | 1255 | 15 |
| LG | 1070 | 23 |
| P | 50 | 15 |
| PG | 760 | 80 |
| Resistors | Value (Ω) | |
| RR | 3410 | |
| R | 100 | |
| r | 5 | |
| Capacitors | Value (pF) | |
| CC | 0.94 | |
| C | 10 | |
| Transistors | $L_T$ Gate length (μm) | $l_T$ gate width (μm) | $V_T$ pinch-off voltage (V) |
| T | 4 | 92 | −1 |
| $T^1$ | 4 | 92 | −1 |
| DC power supply | Value (V) | |
| $V_D$ | +6 | |
| $V_{G1}$ | −0.2 | |
| $V_{G2}$ | +2 | |

In a variant of the given values in this Table, if R = 200 Ω, PG can become a width W = 40 μm.

We claim:

1. A semiconductor device comprising a distributed-type monolithic integrated circuit disposed on a substrate for operating at frequencies lying within at least one of a high frequency band and a microwave-frequency band, said circuit including a plurality of coupled stages each having a transistor including first and second electrodes, each said first electrode being AC-coupled to ground through first and second branches, said first branch being directly electrically connected to a first ground stub and said second branch being electrically connected to a second ground stub through a resistor.

2. A semiconductor device as in claim 1 where the plurality of coupled stages include first and second stages including respective first and second ones of said transistors which are disposed adjacent to each other and share a common ground conductor including:
   a. a first portion comprising the first ground stub which is electrically connected to the first branch of the second transistor; and
   b. a second portion comprising the second ground stub which is electrically connected to the second branch of the first transistor through a respective one of said resistors.

3. A semiconductor device as in claim 2 where the circuit comprises an amplifier circuit including said plurality of coupled stages, said transistor in each said stage comprising a field-effect transistor having a source electrode comprising the first electrode, a gate electrode electrically connected to a gate line, and a drain electrode electrically connected to a drain line.

4. A semiconductor device as in claim 3 where, for each said field-effect transistor, the respective source, gate, and drain electrodes are interdigitated, said source electrode including first and second source-electrode stubs comprising said first and second branches, respectively, said gate and drain electrodes being disposed between said first and second source-electrode stubs.

5. A semiconductor device as in claim 4 where each said resistor and an inductance of each said ground stub have predetermined low values.

6. A semiconductor device as in claim 4 where:
   a. the common ground conductor is disposed between the first source-electrode stub of the second transistor and the second source-electrode stub of the first transistor; and
   b. the resistor through which the second portion of said common ground conductor is electrically connected to the second source-electrode stub of the first transistor has portions which overlap respective portions of said second portion and said second source-electrode stub.

7. A semiconductor device as in claim 3 where the drain electrode of each said field-effect transistor is electrically connected to the drain line through a further respective transistor.

8. A semiconductor device as in claim 1 or 2 where the circuit is formed in microstrip on one side of a substrate which has a ground plane on an opposite side thereof, said substrate including via holes through which said ground stubs are electrically connected to said ground plane.

9. A semiconductor device as in claim 8 where the substrate comprises a material selected from the III–V group of the periodic table.

10. A semiconductor device as in claim 9 where the substrate material comprises gallium arsenide.

11. A semiconductor device as in claim 1 or 2 where the circuit comprises a mixer.

* * * * *